US008067964B2

(12) United States Patent
Numata et al.

(10) Patent No.: US 8,067,964 B2
(45) Date of Patent: Nov. 29, 2011

(54) OUTPUT CIRCUIT

(75) Inventors: Tomoyuki Numata, Yokohama (JP);
Norio Nagase, Yokohama (JP)

(73) Assignee: Fujitsu Semiconductor Limited,
Yokohama (JP)

( * ) Notice: Subject to any disclaimer, the term of this patent is extended or adjusted under 35 U.S.C. 154(b) by 0 days.

(21) Appl. No.: 12/552,942

(22) Filed: Sep. 2, 2009

(65) Prior Publication Data

US 2009/0315606 A1   Dec. 24, 2009

Related U.S. Application Data

(63) Continuation of application No. PCT/JP2007/055092, filed on Mar. 14, 2007.

(51) Int. Cl.
*H03B 1/00* (2006.01)
*H03K 3/00* (2006.01)
(52) U.S. Cl. ........................................ 327/108
(58) Field of Classification Search ............ 327/108
See application file for complete search history.

(56) References Cited

U.S. PATENT DOCUMENTS

| 5,949,259 | A | 9/1999 | Garcia | |
|---|---|---|---|---|
| 6,389,092 | B1* | 5/2002 | Momtaz | 375/376 |
| 6,414,524 | B1* | 7/2002 | Chen | 327/112 |
| 2006/0038596 | A1* | 2/2006 | Wang | 327/158 |

FOREIGN PATENT DOCUMENTS

| JP | 05-048420 A | 2/1993 |
|---|---|---|
| JP | 09-172356 A | 6/1997 |
| JP | 11-088130 A | 3/1999 |
| JP | 2001-508635 A | 6/2001 |
| JP | 2005-217840 A | 8/2005 |
| JP | 2005-236395 A | 9/2005 |
| WO | WO-99/26340 A1 | 5/1999 |

* cited by examiner

*Primary Examiner* — Lincoln Donovan
*Assistant Examiner* — Daniel Rojas
(74) *Attorney, Agent, or Firm* — Arent Fox LLP

(57) ABSTRACT

The present invention is aimed at providing an output circuit that is of relatively small scale and may perform adjustment to make the output-signal rise slew rate and the fall slew rate equal to each other. An output circuit includes a signal output unit configured to produce at a signal output node a signal that makes transition between a first potential and a second potential, a load circuit having a variable load, and a first switch circuit configured to select one of electrical conduction and non-conduction between the signal output node and the load circuit.

11 Claims, 13 Drawing Sheets

US 8,067,964 B2

OUTPUT CIRCUIT

CROSS-REFERENCE TO RELATED APPLICATIONS

This is a continuation of International Application No. PCT/JP2007/055092, filed on Mar. 14, 2007, the entire contents of which are hereby incorporated by reference.

FIELD

The present application generally relates to pulse circuits, and particularly relates to an output circuit for outputting a pulse signal.

BACKGROUND

An output circuit of a CMOS type comprised of series-connected PMOS and NMOS transistors is generally used at the signal output part of a semiconductor integrated circuit. A signal that is to be output to outside the circuit is applied to the gates of the PMOS transistor and the NMOS transistor to control the on-and-off state of each transistor. With this configuration, a joint point between the PMOS transistor and the NMOS transistor is electrically coupled to a selected one of the HIGH side (i.e., power supply voltage side) and the LOW side (i.e., ground voltage side). An output signal is output from an output node through a connection between the output node and the joint node between the PMOS transistor and the NMOS transistor.

The CMOS output circuit as described above may preferably be designed such that the rise slope (i.e., rise slew) and fall slope (i.e., fall slew) of an output signal have a substantially identical slope in a balanced manner. To this end, the drive power of each transistor and/or the delay along a path through which the gate input is applied to each transistor may be adjusted to control the rise slew rate and fall slew rate of the output signal independently of each other. With such a method, however, it may be difficult to perform fine adjustment to make the rise slew rate and the fall slew rate equal to each other. That is, it may be difficult to design a balanced CMOS output circuit.

There is another type of system, in which each of the PMOS transistor side and the NMOS transistor side is comprised of a plurality of transistors connected in parallel to each other. The number of transistors driven is changed to control the slew rates of the output signal. This type of circuit, however, has problems in that the circuit scale is increased and in that fine adjustment is difficult due to the fact that changes in the drive power achieved by changing the number of transistors driven are not continuous but stepwise.

[Patent Document 1] Japanese National Publication of International Patent Application No. 2001-508635
[Patent Document 2] Japanese Laid-open Patent Publication No. 2005-217840
[Patent Document 3] Japanese Laid-open Patent Publication No. 2005-236395

SUMMARY

An output circuit includes a signal output unit configured to produce at a signal output node a signal that makes transition between a first potential and a second potential, a load circuit having a variable load, and a first switch circuit configured to select one of electrical conduction and non-conduction between the signal output node and the load circuit.

DESCRIPTION

In the following, embodiments will be described with reference to the accompanying drawings.

Figure 1:
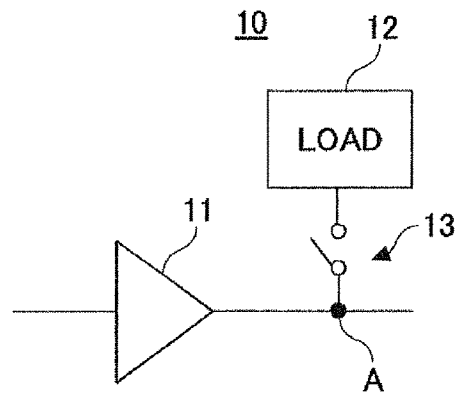
FIG. 1 is a drawing illustrating an example of the configuration of an output circuit.

FIG. 1 is a drawing illustrating an example of the configuration of an output circuit. An output circuit of FIG. 1 includes a signal output unit 11, a load circuit 12, and a switch circuit 13.

The signal output unit 11 produces, at a signal output node A, a signal that makes transition between a first potential (e.g., HIGH) and a second potential (e.g., LOW). The load circuit 12 is a circuit having a variable load, and may be comprised of a variable capacitance element or variable resistance element. The switch circuit 13 serves to switch between an electrically conductive state and an electrically nonconductive state between the signal output node A and the load circuit 12.

The switch circuit 13 may be controlled to switch over between the conductive and nonconductive states substantially in synchronization with transitions that is made by the signal produced at the signal output node A by the signal output unit 11 between the first potential and the second potential. Namely, the switch circuit 13 may become conductive slightly earlier than a rise transition of the signal produced by the signal output unit 11 at the signal output node A when the signal rises from LOW to HIGH, so that the signal at the signal output node A rises from LOW to HIGH with the load circuit 12 being electrically coupled to the signal output node A. Further, the switch circuit 13 may become nonconductive slightly earlier than a fall transition of the signal produced by the signal output unit 11 at the signal output node A when the signal falls from HIGH to LOW, so that the signal at the signal output node A falls from HIGH to LOW with the load circuit 12 being electrically disconnected from the signal output node A. The control of conductive-and-nonconductive states of the switch circuit 13 slightly earlier than the rise and fall transitions makes it possible to suppress switching noise.

With the configuration described above, the load of the load circuit 12 serves to delay a rise change of the signal at the time of signal rise transition. The rise slew rate of the signal thus becomes small. Namely, a signal delay arguably increases. The rise slew rate of the signal in this case changes in response to the size of load of the load circuit 12. Adjustment of the size of load can thus control the rise slew rate. On the other hand, the load of the load circuit 12 is not connected at the time of signal fall transition. The fall slew rate of the signal is thus dependent on the characteristics of the signal output unit 11 and the signal output node A, thereby being fixed to a constant value.

Accordingly, adjustment of the size of load of the load circuit 12 makes it possible to adjust the slope of a rise edge thereby to make it equal to the slope of a fall edge. Namely, such control is attained that one of the signal rise edge and the signal fall edge is controlled independently of the other to make the slopes of these two edges equal to each other. In the example described above, the configuration is such that the load circuit 12 is connected at the time of signal rise transition, and is not connected at the time of signal fall transition. Conversely, provision may be made such that the load circuit 12 is connected at the time of signal fall transition, and is not connected at the time of signal rise transition. Similar advantages are also achieved by such a configuration.

Figure 2:
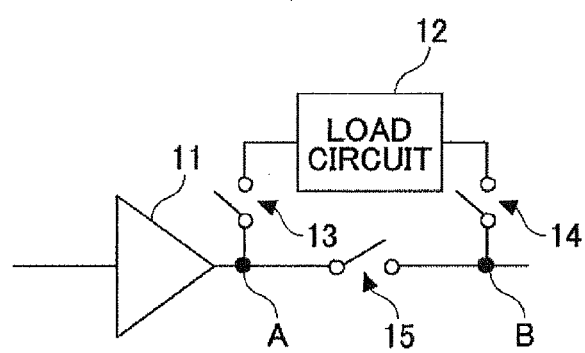
FIG. 2 is a drawing illustrating an example of a variation of the output circuit of FIG. 1.

FIG. 2 is a drawing illustrating an example of a variation of the output circuit of FIG. 1. In FIG. 2, the same elements as those of FIG. 1 are referred to by the same numerals, and a description thereof will be omitted.

An output circuit of FIG. 2 includes the signal output unit 11, the load circuit 12, and the switch circuit 13, and further includes a switch circuit 14 and a switch circuit 15. A first signal path coupling between a signal node B and the signal output node A has the switch circuit 15 inserted therein. The switch circuit 14 is inserted between the signal node B and the load circuit 12. The switch circuits 13 through 15 may be controlled to select one of the above-noted first signal path and a second signal path that extends from the signal output node A to the signal node B via the switch circuit 13, the load circuit 12, and the switch circuit 14.

Namely, the switch circuits 13, 14, and 15 become conductive, conductive, and nonconductive, respectively, slightly earlier than a rise transition of the signal produced by the signal output unit 11 at the signal output node A when the signal rises from LOW to HIGH, so that the signal at the signal output node A rises from LOW to HIGH with the load circuit 12 being electrically coupled to the signal output node A. This signal propagates through the second signal path to reach the signal node B. Further, the switch circuits 13, 14, and 15 become nonconductive, nonconductive, and conductive, respectively, slightly earlier than a fall transition of the signal produced by the signal output unit 11 at the signal output node A when the signal falls from HIGH to LOW, so that the signal at the signal output node A falls from HIGH to LOW with the load circuit 12 being electrically disconnected from the signal output node A. This signal propagates through the first signal path to reach the signal node B.

With the configuration illustrated in FIG. 2, the load of the load circuit 12 also serves to delay a rise change of the signal at the time of signal rise transition as in the case of FIG. 1. The rise slew rate of the signal thus becomes small. On the other hand, the load of the load circuit 12 is not connected at the time of signal fall transition. The fall slew rate of the signal is thus dependent on the characteristics of the signal output unit 11, the signal output node A, the switch circuit 15, and the signal node B, thereby being fixed to a constant value.

Accordingly, adjustment of the size of load of the load circuit 12 makes it possible to adjust the slope of a rise edge thereby to make it equal to the slope of a fall edge. Namely, such control is attained that one of the signal rise edge and the signal fall edge is controlled independently of the other to make the slopes of these two edges equal to each other. In the example described above, the configuration is such that the load circuit 12 is connected at the time of signal rise transition, and is not connected at the time of signal fall transition. Conversely, provision may be made such that the load circuit 12 is connected at the time of signal fall transition, and is not connected at the time of signal rise transition. Similar advantages are also achieved by such a configuration.

In the configuration illustrated in FIG. 2, the switch circuits 13 through 15 are inserted in series into a signal propagation path, so that the ON resistances of these switch circuits serve to increase the signal delay. Accordingly, not only the size of load of the load circuit 12 is adjusted, but also the resistance values of ON resistance of the switch circuits 13 through 15 may properly be selected and used for the purpose of controlling the slope of a signal rise edge and the slope of a signal fall edge.

Figure 3:
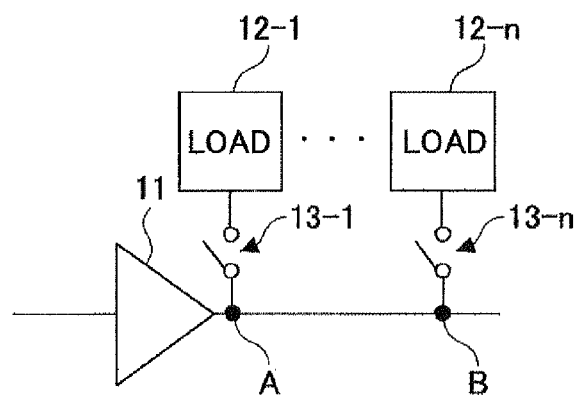
FIG. 3 is a drawing illustrating an example of a further variation of the output circuit of FIG. 1.

FIG. 3 is a drawing illustrating an example of a further variation of the output circuit of FIG. 1. In FIG. 3, the same elements as those of FIG. 1 are referred to by the same numerals, and a description thereof will be omitted.

An output circuit of FIG. 3 includes the signal output unit 11, load circuits 12-1 through 12-n, and switch circuits 13-1 through 13-n. A plurality of load circuits 12-1 through 12-n is provided in place of the load circuit 12 of FIG. 1, and a plurality of switch circuits 13-1 through 13-n is provided in place of the switch circuit 13. The load circuits 12-1 through 12-n are coupled to the signal output node A via the respective switch circuits 13-1 through 13-n.

Which load circuits among the load circuits 12-1 through 12-n are electrically connected to the signal output node A are determined in accordance with transitions of the signal output from the signal output unit 11. For example, the load circuit 12-1 may be electrically connected to the signal output node A when the signal at the signal output node A falls from HIGH to LOW, and the load circuit 12-2 may be electrically connected to the signal output node A when the signal at the signal output node A rises from LOW to HIGH. With such a configuration, the size of load may be adjusted independently between the load circuit 12-1 and the load circuit 12-2 thereby to control the rise slew rate and the fall slew rate independently of each other.

The number n of the load circuits 12-1 through 12-n may be two or more. When transition is made from the second potential (e.g., LOW) to a third potential (e.g., extra-HIGH), for example, the load circuit 12-3 that is different from the load circuits 12-1 and 12-2 may be electrically connected. Further, different load circuits may be used as an electrically connected load circuit depending on operation modes with respect to the same type of transition such as a transition from the second potential (e.g., LOW) to the first potential (e.g., HIGH).

Figure 4:
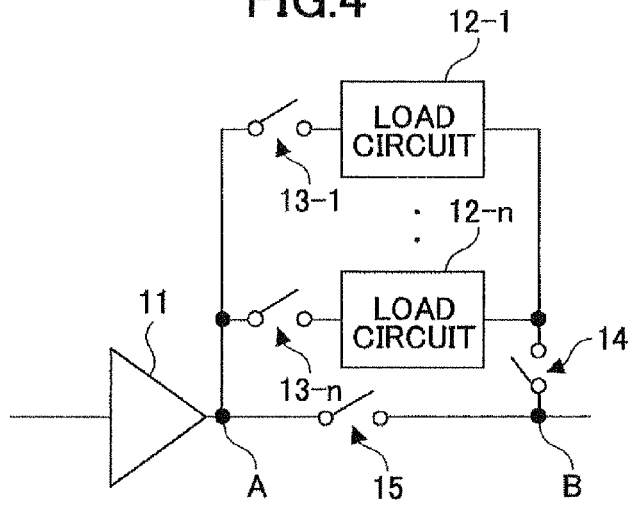
FIG. 4 is a drawing illustrating an example of a further variation of the output circuit of FIG. 1.

FIG. 4 is a drawing illustrating an example of a further variation of the output circuit of FIG. 1. In FIG. 4, the same elements as those of FIG. 2 and FIG. 3 are referred to by the same numerals, and a description thereof will be omitted.

An output circuit of FIG. 4 includes the signal output unit 11, the load circuits 12-1 through 12-n, and the switch circuits 13-1 through 13-n, and further includes the switch circuit 14 and the switch circuit 15. A first signal path coupling between a signal node B and the signal output node A has the switch circuit 15 inserted therein. The switch circuit 14 is inserted between the signal node B and the load circuits 12-1 through 12-n. The switch circuits 13-1 through 13-n, 14, and 15 may be controlled to select one of the above-noted first signal path and a second signal path that extends from the signal output node A to the signal node B via the switch circuit 13-x (x: selected value), the load circuit 12-x, and the switch circuit 14.

In the configuration illustrated in FIG. 4, as in the configurations of FIG. 3, which load circuits among the load circuits 12-1 through 12-n are electrically connected to the signal output node A are determined in accordance with transitions of the signal output from the signal output unit 11. As in the configuration of FIG. 2, further, switch circuits are inserted in series into a signal propagation path. Accordingly, the resistance values of ON resistance of these switch circuits may properly be selected and used for the purpose of controlling the slope of a signal rise edge and the slope of a signal fall edge.

Figure 5:
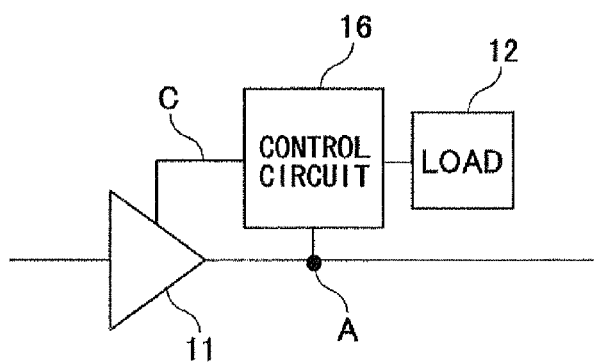
FIG. 5 is a drawing illustrating an example of a further variation of the output circuit of FIG. 1.

FIG. 5 is a drawing illustrating an example of a further variation of the output circuit of FIG. 1. In FIG. 5, the same elements as those of FIG. 1 are referred to by the same numerals, and a description thereof will be omitted.

The configuration illustrated in FIG. 5 employs a control circuit 16 to implement the switching function of the output circuit of FIG. 1 and the load adjustment function of the load circuit 12. Namely, provision is made such that the control circuit 16 controls the electrical coupling and decoupling states of the load circuit 12 with respect to the signal output node A. Namely, the control circuit 16 is configured to switch between electrically connecting and disconnecting the load circuit 12 to and from the signal output node A in response to a control signal C supplied from the signal output unit 11. Further, the control circuit 16 is configured to adjust the size of load of the load circuit 12.

Figure 6:
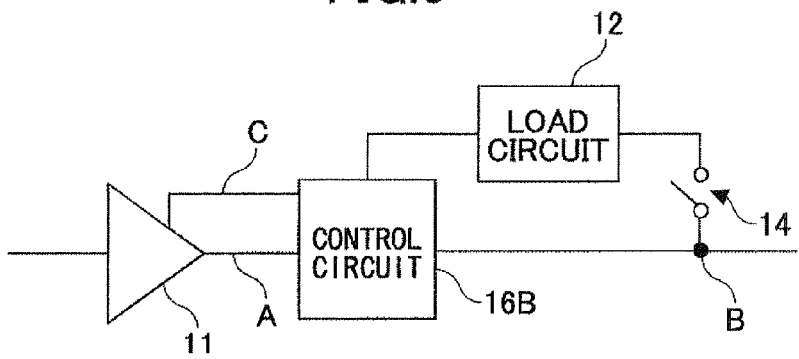
FIG. 6 is a drawing illustrating an example of a variation of the output circuit of FIG. 5.

FIG. 6 is a drawing illustrating an example of a variation of the output circuit of FIG. 5. In FIG. 6, the same elements as those of FIG. 2 and FIG. 5 are referred to by the same numerals, and a description thereof will be omitted.

An output circuit of FIG. 5 includes the signal output unit 11, the load circuit 12, the switch circuit 14, and a control circuit 16B. This configuration employs a control circuit 16B to implement the switching function of the switch circuits 13 and 15 of the output circuit of FIG. 2 and the load adjustment function of the load circuit 12. Namely, the control circuit 16B is configured to switch between electrically connecting and disconnecting the load circuit 12 to and from the signal output node A in response to a control signal C supplied from the signal output unit 11. Further, the control circuit 16B is configured to switch between electrically connecting and disconnecting the signal output node A to and from the signal node B in response to the control signal C supplied from the signal output unit 11. Further, the control circuit 16B is configured to adjust the size of load of the load circuit 12.

Differences in advantages between the configuration illustrated in FIG. 6 and the configuration illustrated in FIG. 5 are similar to the differences in advantages between the configuration illustrated in FIG. 2 and the configuration illustrated in FIG. 1.

Figure 7:
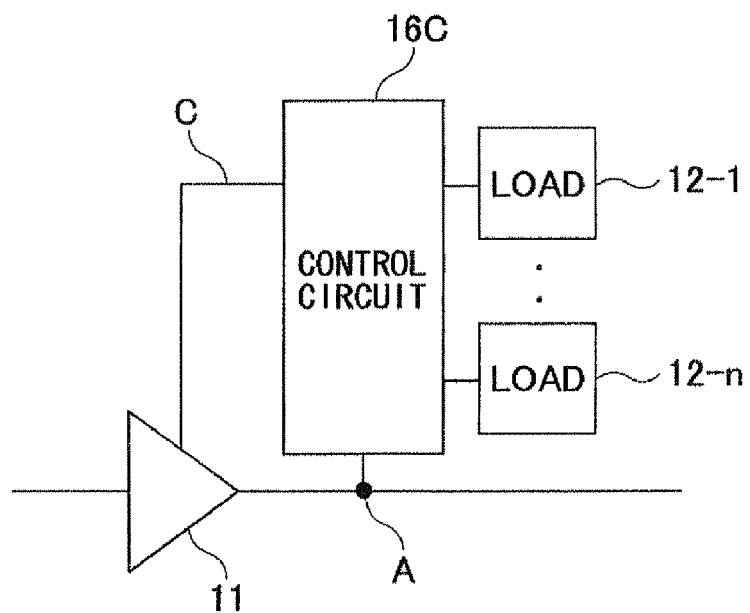
FIG. 7 is a drawing illustrating an example of a further variation of the output circuit of FIG. 5.

FIG. 7 is a drawing illustrating an example of a further variation of the output circuit of FIG. 5. In FIG. 7, the same elements as those of FIG. 3 and FIG. 5 are referred to by the same numerals, and a description thereof will be omitted.

An output circuit of FIG. 7 includes the signal output unit 11, the load circuits 12-1 through 12-n, and a control circuit 16C. The output circuit illustrated in FIG. 7 employs a control circuit 16C to implement the switching function of the switch circuits 13-1 through 13-n of the output circuit of FIG. 3 and the load adjustment function of the load circuits 12-1 through 12-n. Namely, the control circuit 16C is configured to switch between electrically connecting and disconnecting the load circuits 12-1 through 12-n to and from the signal output node A in response to a control signal C supplied from the signal output unit 11. Further, the control circuit 16C is configured to adjust the size of load of the load circuits 12-1 through 12-n.

Differences in advantages between the configuration illustrated in FIG. 7 and the configuration illustrated in FIG. 5 are similar to the differences in advantages between the configuration illustrated in FIG. 3 and the configuration illustrated in FIG. 1.

Figure 8:
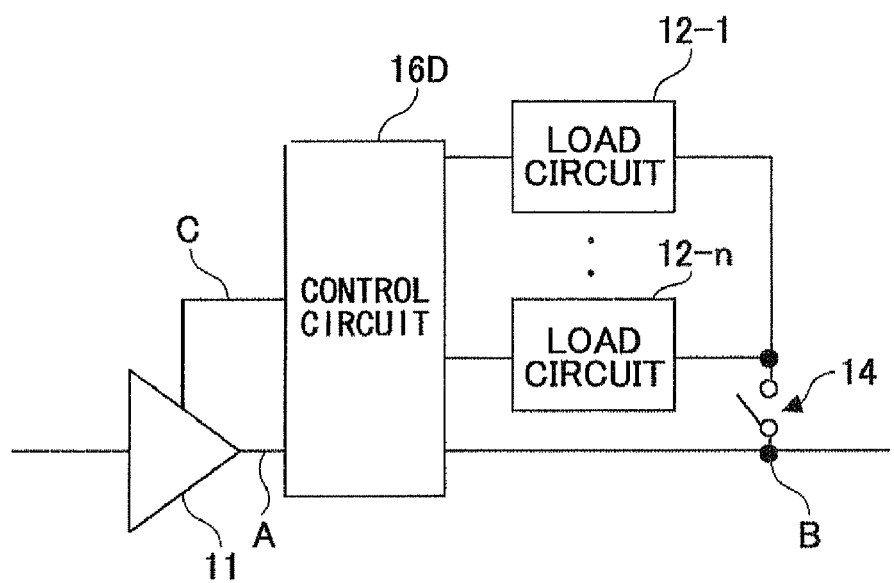
FIG. 8 is a drawing illustrating an example of a further variation of the output circuit of FIG. 5.

FIG. 8 is a drawing illustrating an example of a further variation of the output circuit of FIG. 5. In FIG. 8, the same elements as those of FIG. 4 and FIG. 5 are referred to by the same numerals, and a description thereof will be omitted.

An output circuit of FIG. 8 includes the signal output unit 11, the load circuits 12-1 through 12-n, the switch circuit 14, and a control circuit 16D. The output circuit illustrated in FIG. 8 employs a control circuit 16D to implement the switching function of the switch circuits 13-1 through 13-n and 15 of the output circuit of FIG. 4 and the load adjustment function of the load circuits 12-1 through 12-n. Namely, the control circuit 16D is configured to switch between electrically connecting and disconnecting the load circuits 12-1 through 12-n to and from the signal output node A in response to a control signal C supplied from the signal output unit 11. Further, the control circuit 16D is configured to switch between electrically connecting and disconnecting the signal output node A to and from the signal node B in response to the control signal C supplied from the signal output unit 11. Moreover, the control circuit 16D is configured to adjust the size of load of the load circuits 12-1 through 12-n.

Differences in advantages between the configuration illustrated in FIG. 8 and the configuration illustrated in FIG. 5 are similar to the differences in advantages between the configuration illustrated in FIG. 4 and the configuration illustrated in FIG. 1.

Figure 9:
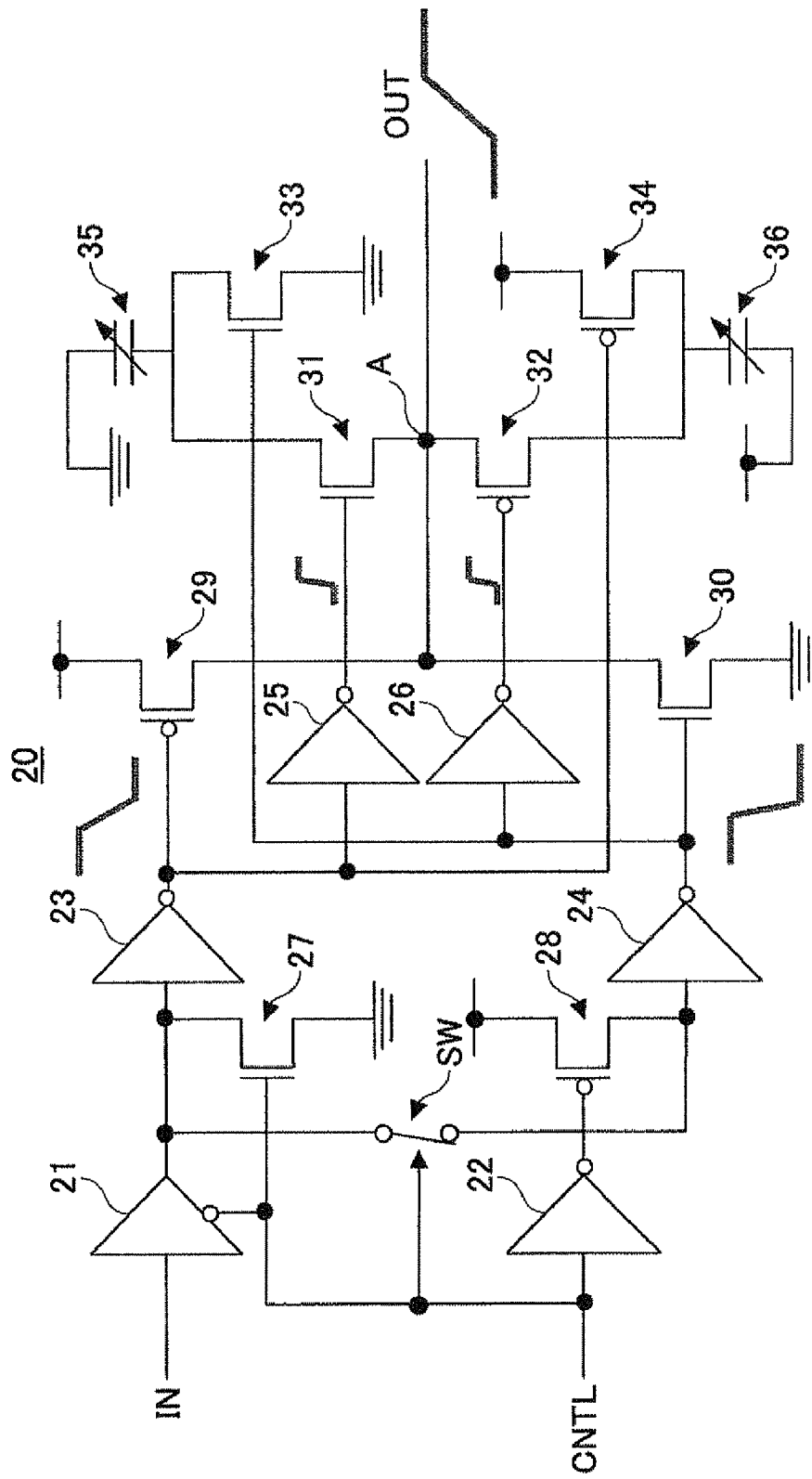
FIG. 9 is a drawing illustrating an example of the configuration of an embodiment of an output circuit.

FIG. 9 is a drawing illustrating an example of the configuration of an embodiment of an output circuit. The circuit configuration illustrated in FIG. 9 corresponds to the configuration illustrated in FIG. 3. An output circuit 20 illustrated in FIG. 9 includes buffers 21 through 26, an NMOS transistor 27, a PMOS transistor 28, a PMOS transistor 29, an NMOS transistor 30, an NMOS transistor 31, a PMOS transistor 32, an NMOS transistor 33, a PMOS transistor 34, a variable-capacitance element 35, and a variable-capacitance element 36.

The buffer 21 is a circuit that receives an input signal IN at the input node and outputs a signal having the same logical value as the received input signal IN from the output node. Each of the buffers 23 and 24 is an inverter circuit that inverts an input signal received at its input node for provision to its output node, and that receives the output signal of the buffer 21 at the input node. When the input signal IN into the buffer 21 is a positive-transition signal rising from LOW to HIGH, the output of the buffer 23 and the output of the buffer 24 are negative-transition signals falling from HIGH to LOW as illustrated as waveforms beside their respective output nodes in FIG. 9.

The buffers 25 and 26 are an inverter circuit that inverts an input signal received at its input node for provision to its output node, and receive the output signals of the buffers 23 and 24 at their input nodes, respectively. When the negative-transition signals falling from HIGH to LOW as illustrated in FIG. 9 are supplied, the output of the buffer 25 and the output of the buffer 26 are positive-transition signals rising from LOW to HIGH as illustrated as waveforms beside their respective output nodes in FIG. 9.

In this case, the NMOS transistor 31 becomes conductive in response to the positive transition of the output of the buffer 25, and the PMOS transistor 32 becomes nonconductive in response to the positive transition of the output of the buffer 26. As a result, the signal output node A is electrically coupled to the variable-capacitance element 35 serving as a variable-load load circuit. In this manner, electrical connection and disconnection of the variable-capacitance element 35 to and from the signal output node A are controlled in response to the signal level of the signal that controls the conductive and nonconductive states of the PMOS transistor 29 and the NMOS transistor 30, i.e., controlled substantially in synchronization with the transitions of the signal level at the signal output node A.

With the signal output node A being electrically connected to the variable-capacitance element 35, the PMOS transistor 29 becomes conductive in response to a negative transition of the output of the buffer 23, and the NMOS transistor 30 becomes nonconductive in response to a negative transition of the output of the buffer 24. Accordingly, the signal output node A changes from LOW (i.e., ground potential to which the source node of the NMOS transistor 30 is coupled) to HIGH (i.e., power supply potential to which the source node of the PMOS transistor 29 is coupled).

When this happens, the signal output node A is electrically connected to the variable-capacitance element 35, so that the variable-capacitance element 35 serves to delay a voltage rise at the signal output node A. Namely, the speed of the voltage rise at the signal output node A is responsive to the speed at which electric charge is accumulated in the variable-capacitance element 35 through an inflow of electric current. The larger the capacitance of the variable-capacitance element 35, the slower the voltage rise at the signal output node A. The smaller the capacitance of the variable-capacitance element 35, the faster the voltage rise at the signal output node A. Accordingly, the adjustment of a capacitance value (i.e., the size of load) of the variable-capacitance element 35 makes it possible to control the speed of voltage rise at the signal output node A. Namely, it may be possible to control the rise slew rate of an output signal OUT.

When the input signal IN into the buffer 21 is a negative-transition signal falling from HIGH to LOW, the output of the buffer 23 and the output of the buffer 24 are positive-transition signals rising from LOW to HIGH. In this case, the output of the buffer 25 and the output of the buffer 26 are negative-transition signals falling from HIGH to LOW. In this case, the NMOS transistor 31 becomes nonconductive in response to the negative transition of the output of the buffer 25, and the PMOS transistor 32 becomes conductive in response to the negative transition of the output of the buffer 26. As a result, the signal output node A is electrically coupled to the variable-capacitance element 36 serving as a variable-load load circuit. In this manner, electrical connection and disconnection of the variable-capacitance element 36 to and from the signal output node A are controlled in response to the signal level of the signal that controls the conductive and nonconductive states of the PMOS transistor 29 and the NMOS transistor 30, i.e., controlled substantially in synchronization with the transitions of the signal level at the signal output node A.

With the signal output node A being electrically connected to the variable-capacitance element 36, the PMOS transistor 29 becomes nonconductive in response to a positive transition of the output of the buffer 23, and the NMOS transistor 30 becomes conductive in response to a positive transition of the output of the buffer 24. Accordingly, the signal output node A changes from HIGH to LOW.

When this happens, the signal output node A is electrically connected to the variable-capacitance element 36, so that the variable-capacitance element 36 serves to delay a voltage fall at the signal output node A. Namely, the speed of the voltage fall at the signal output node A is responsive to the speed at which electric charge is accumulated in the variable-capacitance element 36 through an inflow of electric current. The larger the capacitance of the variable-capacitance element 36, the slower the voltage fall at the signal output node A. The smaller the capacitance of the variable-capacitance element 36, the faster the voltage fall at the signal output node A. Accordingly, the adjustment of a capacitance value (i.e., the size of load) of the variable-capacitance element 36 makes it possible to control the speed of voltage fall at the signal output node A. Namely, it may be possible to control the fall slew rate of the output signal OUT. At this time, the NMOS transistor 33 becomes conductive in response to the positive transition of the buffer 24. The variable-capacitance element 35, which is not electrically connected to the signal output node A, thus discharges to return to a no-charge state.

In this manner, the adjustment of a capacitance value (i.e., the size of load) of the variable-capacitance element 35 in the output circuit 20 illustrated in FIG. 9 can control the speed of voltage rise at the signal output node A, i.e., control the rise slew rate of the output signal OUT. Further, the adjustment of a capacitance value (i.e., the size of load) of the variable-capacitance element 36 can control the speed of voltage fall at the signal output node A, i.e., control the fall slew rate of the output signal OUT. Accordingly, the capacitance value of the variable-capacitance element 35 and the capacitance value of the variable-capacitance element 36 may continuously be adjusted independently of each other, thereby continuously changing the rise slew rate and fall slew rate of the output signal OUT independently of each other. It is thus possible to make the rise slew rate of the output signal OUT equal to the fall slew rate.

A control signal CNTL is LOW in an operating state in which the output circuit 20 transmits an output signal, and is HIGH when there is a case to place the signal output node A in a HIGH impedance state. As the control signal CNTL is set to HIGH, the operation of the buffer 21 is suspended (i.e., placed in an inactive state), and a switch SW is opened, with both the NMOS transistor 27 and the PMOS transistor 28 placed in the conductive state. As a result, the input of the buffer 23 is fixed to LOW, and, thus, its output is fixed to HIGH. Further, the input of the buffer 24 is fixed to HIGH, and, thus, its output is fixed to LOW. All the PMOS transistor 29, the NMOS transistor 30, the NMOS transistor 31, and the PMOS transistor 32 become nonconductive, so that the signal output node A is placed in the HIGH-impedance state.

There are cases in which the signal input node and signal output node are one and the same in a semiconductor integrated circuit. In an output circuit used for such a two-way input-and-output terminal, the signal output node A illustrated in FIG. 9, for example, is electrically connected to an input node, so that an input signal voltage is applied to the signal output node A at the time of input operations. In such a case, there may be a case to stop the operation of the output circuit 20 to place the signal output node A in the HIGH-impedance state. The control signal CNTL is used for this purpose.

Figure 10:
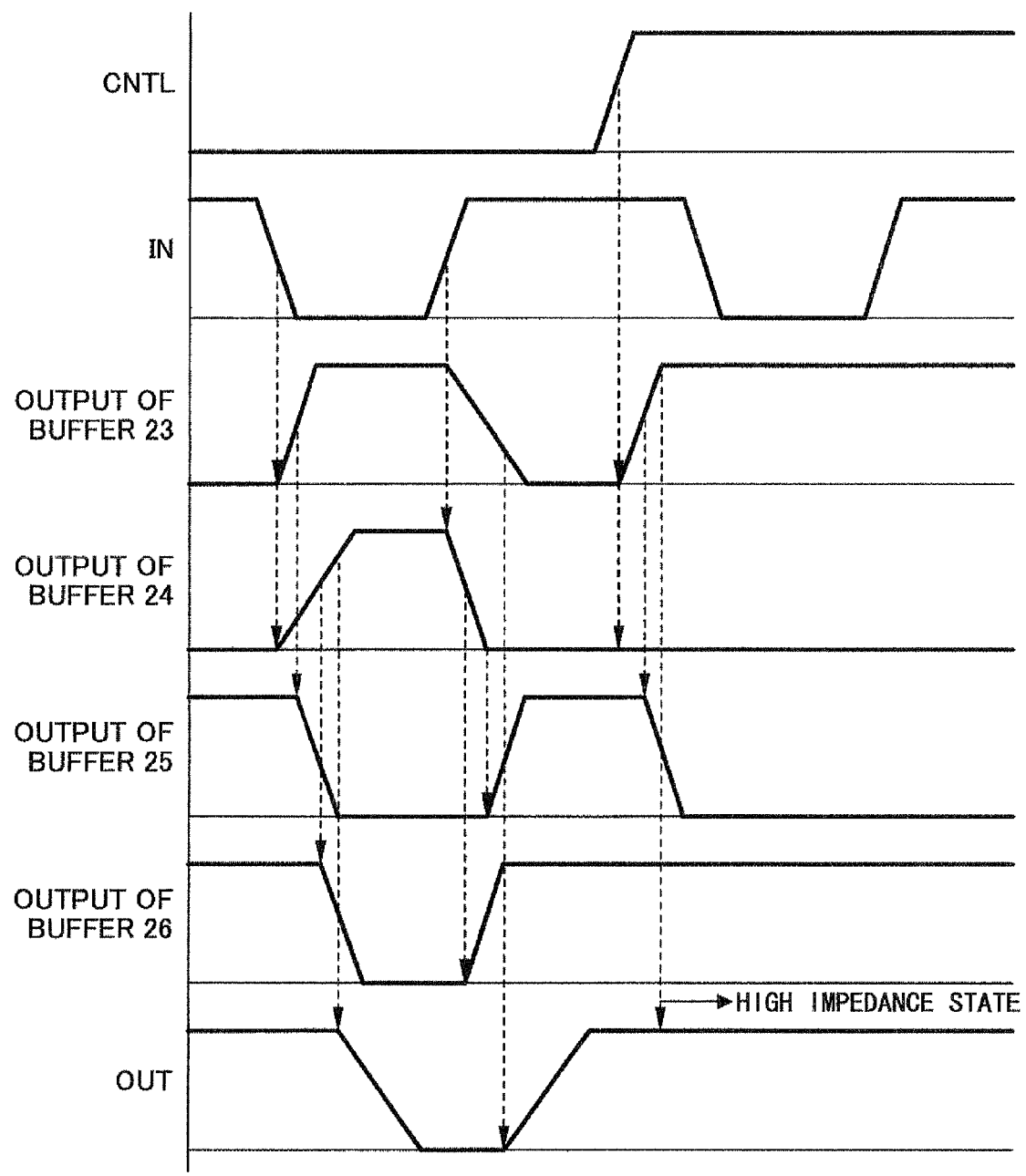
FIG. 10 is a drawing for explaining the operation of the output circuit illustrated in FIG. 9.

FIG. 10 is a drawing for explaining the operation of the output circuit 20 illustrated in FIG. 9. It is preferable for the circuit elements such as buffers and transistors of the output circuit 20 to satisfy the conditions as described in the following for the purpose of guaranteeing proper operations.

The rise slew rate of the output of the buffer 23 may preferably be larger (i.e., steeper) than the rise slew rate of the output of the buffer 24 as illustrated in FIG. 10. This is because it is desirable to make the PMOS transistor 29 nonconductive before the NMOS transistor 30 becomes conductive for the purpose of avoiding a through current flowing through the PMOS transistor 29 and the NMOS transistor 30.

Further, the fall slew rate of the output of the buffer 23 may preferably be smaller (i.e., gentler) than the fall slew rate of the output of the buffer 24 as illustrated in FIG. 10. This is because it is desirable to make the NMOS transistor 30 nonconductive before the PMOS transistor 29 becomes conductive for the purpose of avoiding a through current flowing through the PMOS transistor 29 and the NMOS transistor 30.

Moreover, as can be understood from FIG. 10, a response time from a change in the output of the buffer 23 to a change in the output of the buffer 25 may preferably be substantially equal to a response time from a change in the output of the buffer 24 to a change in the output of the buffer 26. With this arrangement, the NMOS transistor 31 responsive to the output of the buffer 25 becomes nonconductive before the PMOS transistor 32 responsive to the output of the buffer 26 becomes conductive at the time of fall transition of the output signal OUT. Further, the PMOS transistor 32 responsive to the output of the buffer 26 becomes nonconductive before the NMOS transistor 31 responsive to the output of the buffer 25 becomes conductive at the time of rise transition of the output signal OUT. Accordingly, it is possible to avoid a situation in which a signal path is established through which electric charge moves from one of the variable-capacitance elements 35 and 36 to the other.

Moreover, a response time from a change in the output of the buffer 23 to a change in the state of the PMOS transistor 34 may preferably be substantially equal to a response time from a change in the output of the buffer 24 to a change in the state of the NMOS transistor 33. It is also preferable to provide a speed difference between the rise transition and fall transition of the buffers 23 and 24, thereby making the NMOS transistor 33 conductive after the NMOS transistor 31 becomes nonconductive, and making the PMOS transistor 34 conductive after the PMOS transistor 32 becomes nonconductive.

Further, changes in the states of the PMOS transistor 29 and NMOS transistor 30, which are responsive to the outputs of the buffers 23 and 24, respectively, may preferably be slower than changes in the states of the NMOS transistor 31, the PMOS transistor 32, the NMOS transistor 33, and the PMOS transistor 34. With this arrangement, an employed one of the variable-capacitance element 35 and the variable-capacitance element 36 may be electrically connected to the signal output node A before the output signal OUT exhibits a signal level transition as illustrated in FIG. 10.

FIG. 10 also demonstrates a situation in which the output of the buffer 23 is fixed to HIGH, and the output of the buffer 24 is fixed to LOW, with the control signal CNTL being set to HIGH. In this state, all the PMOS transistor 29, the NMOS transistor 30, the NMOS transistor 31, and the PMOS transistor 32 become nonconductive, so that the output signal OUT is placed in the HIGH-impedance state.

In the following, various variations of the embodiment of an output circuit will be described.

Figure 11:
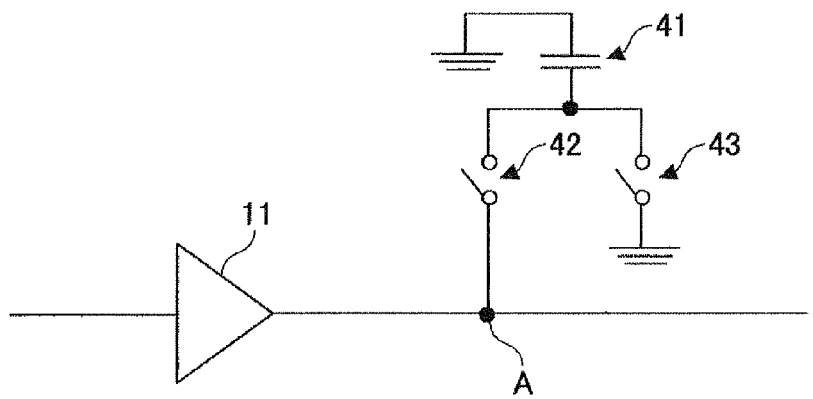
FIG. 11 is a drawing illustrating a variation of the embodiment of an output circuit.

FIG. 11 is a drawing illustrating a variation of the embodiment of an output circuit. In FIG. 11, an output circuit includes the signal output unit 11, a capacitive element 41, and switch circuits 42 and 43. The capacitive element 41 corresponds to the load circuit. When the output signal of the signal output unit 11 is to rise, the switch circuits 42 and 43 are made conductive and nonconductive, respectively, to electrically connect the capacitive element 41 to the signal output node A. The adjustment of a capacitance value of the capacitive element 41 may control the speed of voltage rise at the signal output node A.

When the output signal of the signal output unit 11 is to fall, the switch circuits 42 and 43 are made nonconductive and conductive, respectively, to electrically disconnect the capacitive element 41 from the signal output node A for electrical discharge. In this case, the speed of signal fall at the signal output node A is not affected by the capacitive element 41.

Figure 12:
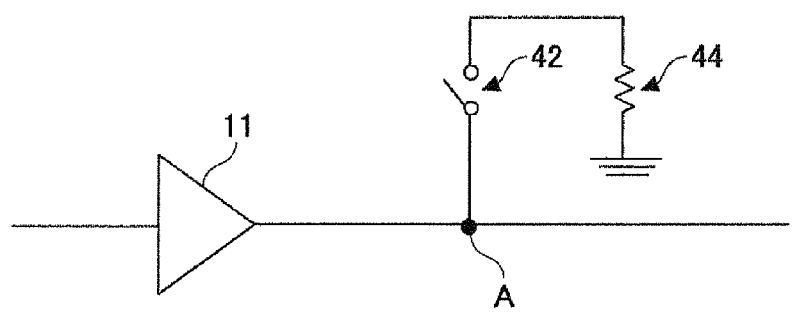
FIG. 12 is a drawing illustrating another variation of the embodiment of an output circuit.

FIG. 12 is a drawing illustrating another variation of the embodiment of an output circuit. In FIG. 12, an output circuit includes the signal output unit 11, a resistive element 44, and the switch circuit 42. The resistive element 44 corresponds to the load circuit. When the output signal of the signal output unit 11 is to rise, the switch circuit 42 is made conductive to electrically connect the resistive element 44 to the signal output node A. The adjustment of a resistance value of the resistive element 44 may control the speed of voltage rise at the signal output node A.

When the output signal of the signal output unit 11 is to fall, the switch circuit 42 is made nonconductive to electrically disconnect the resistive element 44 from the signal output node A. In this case, the speed of signal fall at the signal output node A is not affected by the resistive element 44.

Figure 13:
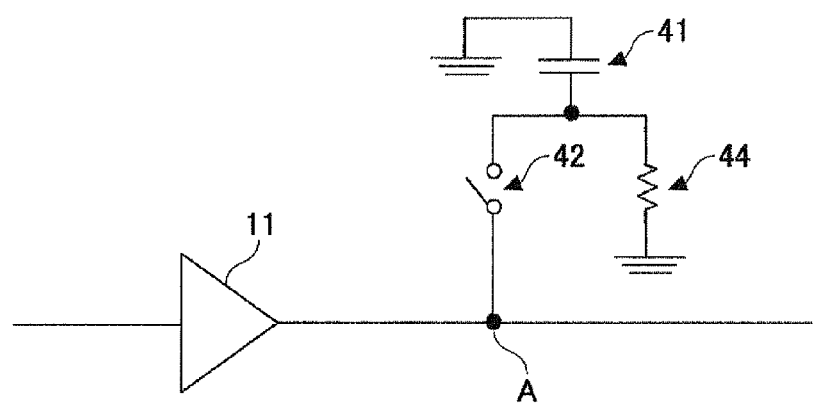
FIG. 13 is a drawing illustrating yet another variation of the embodiment of an output circuit.

FIG. 13 is a drawing illustrating yet another variation of the embodiment of an output circuit. In FIG. 13, an output circuit includes the signal output unit 11, the capacitive element 41, the switch circuit 42, and the resistive element 44. The capacitive element 41 and the resistive element 44 correspond to the load circuit. When the output signal of the signal output unit 11 is to rise, the switch circuit 42 is made conductive to electrically connect the capacitive element 41 and resistive element 44 to the signal output node A. The adjustment of a capacitance value of the capacitive element 41 and of a resistance value of the resistive element 44 may control the speed of voltage rise at the signal output node A.

When the output signal of the signal output unit 11 is to fall, the switch circuit 42 is made nonconductive to electrically disconnect the capacitive element 41 and resistive element 44 from the signal output node A for electrical discharge. In this case, the speed of signal fall at the signal output node A is not affected by the capacitive element 41 and resistive element 44. The above-noted electrical discharge occurs with respect to the capacitive element 41 through the resistive element 44.

Figure 14:
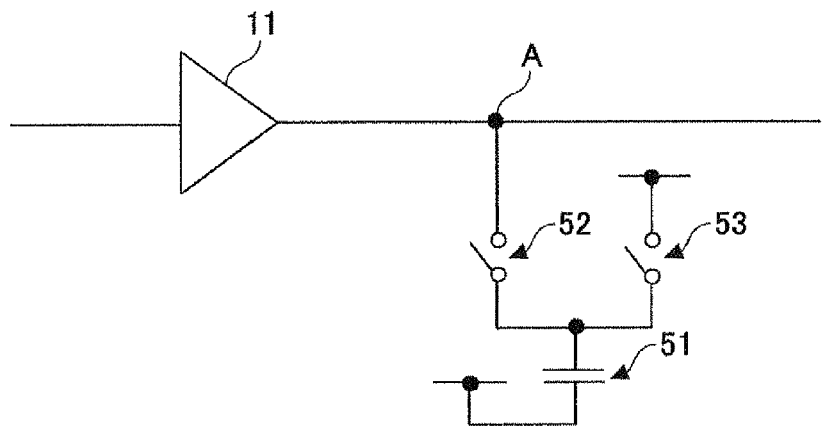
FIG. 14 is a drawing illustrating another variation of the embodiment of an output circuit.

FIG. 14 is a drawing illustrating another variation of the embodiment of an output circuit. In FIG. 14, an output circuit includes the signal output unit 11, a capacitive element 51, and switch circuits 52 and 53. The capacitive element 51 corresponds to the load circuit. When the output signal of the signal output unit 11 is to fall, the switch circuits 52 and 53 are made conductive and nonconductive, respectively, to electrically connect the capacitive element 51 to the signal output node A. The adjustment of a capacitance value of the capacitive element 51 may control the speed of voltage fall at the signal output node A.

When the output signal of the signal output unit 11 is to rise, the switch circuits 52 and 53 are made nonconductive and conductive, respectively, to electrically disconnect the capacitive element 51 from the signal output node A for electrical discharge. In this case, the speed of signal rise at the signal output node A is not affected by the capacitive element 51.

Figure 15:
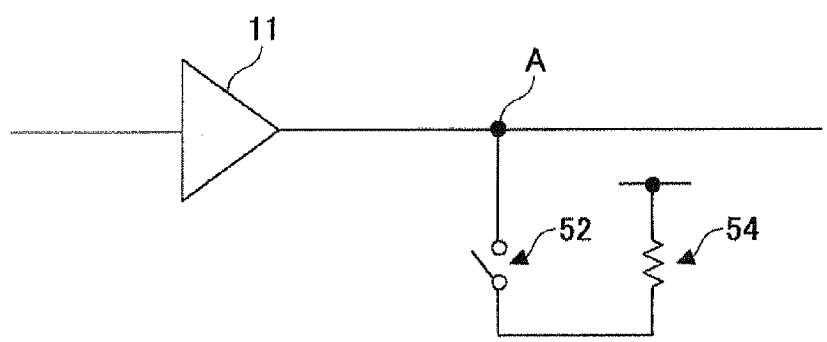
FIG. 15 is a drawing illustrating another variation of the embodiment of an output circuit.

FIG. 15 is a drawing illustrating another variation of the embodiment of an output circuit. In FIG. 15, an output circuit includes the signal output unit 11, a resistive element 54, and the switch circuit 52. The resistive element 54 corresponds to the load circuit. When the output signal of the signal output unit 11 is to fall, the switch circuit 52 is made conductive to electrically connect the resistive element 54 to the signal output node A. The adjustment of a resistance value of the resistive element 54 may control the speed of voltage fall at the signal output node A.

When the output signal of the signal output unit 11 is to rise, the switch circuit 52 is made nonconductive to electrically disconnect the resistive element 54 from the signal output node A. In this case, the speed of signal rise at the signal output node A is not affected by the resistive element 54.

Figure 16:
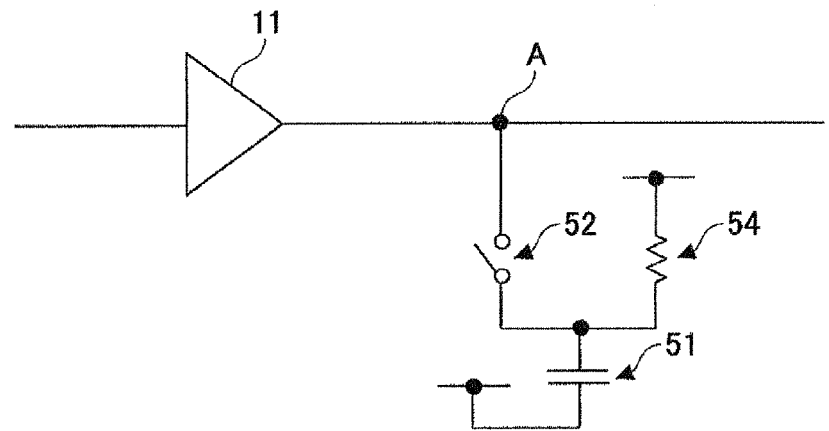
FIG. 16 is a drawing illustrating another variation of the embodiment of an output circuit.

FIG. 16 is a drawing illustrating another variation of the embodiment of an output circuit. In FIG. 16, an output circuit includes the signal output unit 11, the capacitive element 51, the switch circuit 52, and the resistive element 54. The capacitive element 51 and the resistive element 54 correspond to the load circuit. When the output signal of the signal output unit 11 is to fall, the switch circuit 52 is made conductive to electrically connect the capacitive element 51 and resistive element 54 to the signal output node A. The adjustment of a capacitance value of the capacitive element 51 and of a resistance value of the resistive element 54 may control the speed of voltage fall at the signal output node A.

When the output signal of the signal output unit 11 is to rise, the switch circuit 52 is made nonconductive to electrically disconnect the capacitive element 51 and resistive element 54 from the signal output node A for electrical discharge. In this case, the speed of signal rise at the signal output node A is not affected by the capacitive element 51 and resistive element 54. The above-noted electrical discharge occurs with respect to the capacitive element 51 through the resistive element 54.

Figure 17:
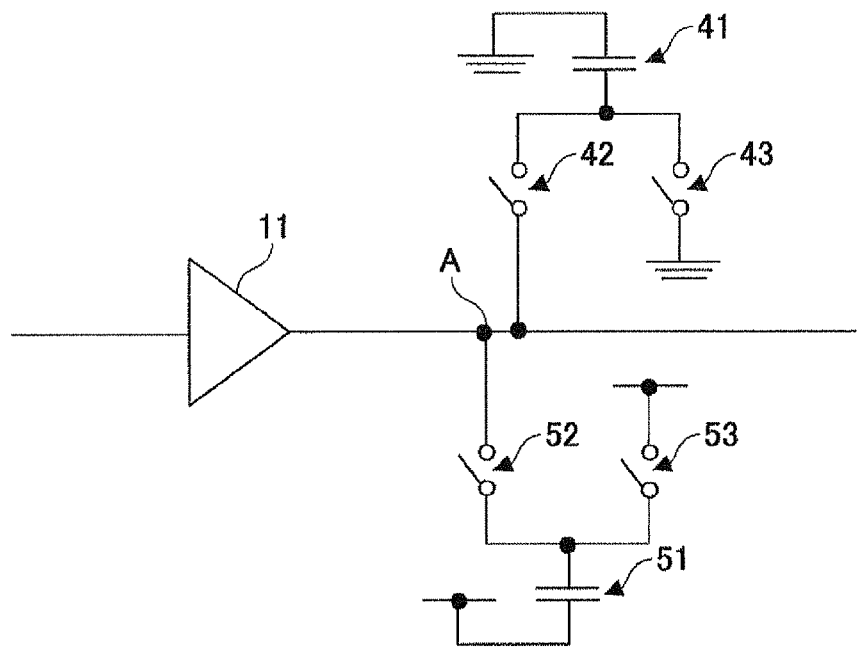
FIG. 17 is a drawing illustrating another variation of the embodiment of an output circuit.

FIG. 17 is a drawing illustrating another variation of the embodiment of an output circuit. In FIG. 17, an output circuit includes the signal output unit 11, the capacitive element 41, the switch circuits 42 and 43, the capacitive element 51, and the switch circuits 52 and 53. The capacitive element 41 and the capacitive element 51 correspond to the load circuit. When the output signal of the signal output unit 11 is to rise, the switch circuits 42 and 43 are made conductive and nonconductive, respectively, to electrically connect the capacitive element 41 to the signal output node A, and the switch circuits 52 and 53 are made nonconductive and conductive, respectively, to electrically disconnect the capacitive element 51 from the signal output node A for electrical discharge. The adjustment of a capacitance value of the capacitive element 41 may control the speed of voltage rise at the signal output node A.

When the output signal of the signal output unit 11 is to fall, the switch circuits 42 and 43 are made nonconductive and conductive, respectively, to electrically disconnect the capacitive element 41 from the signal output node A for electrical discharge, and the switch circuits 52 and 53 are made conductive and nonconductive, respectively, to electrically connect the capacitive element 51 to the signal output node A. The adjustment of a capacitance value of the capacitive element 51 may control the speed of voltage fall at the signal output node A.

Figure 18:
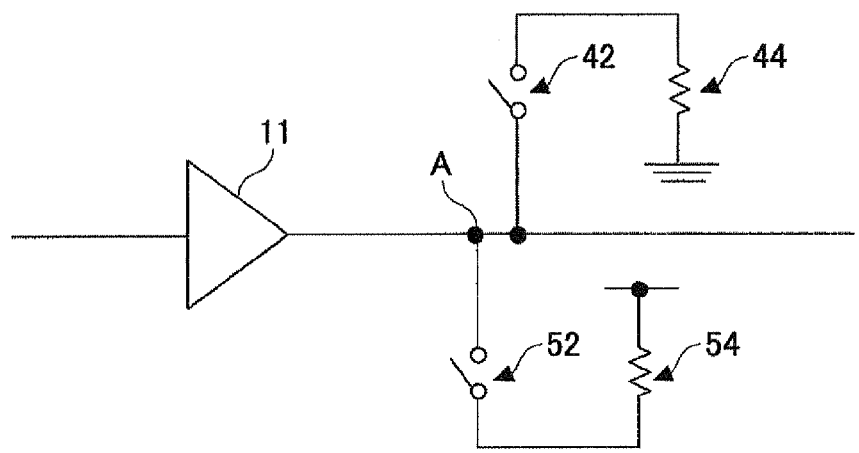
FIG. 18 is a drawing illustrating another variation of the embodiment of an output circuit.

FIG. 18 is a drawing illustrating another variation of the embodiment of an output circuit. In FIG. 18, an output circuit includes the signal output unit 11, the switch circuit 42, the resistive element 44, the switch circuit 52, and the resistive element 54. The resistive element 44 and the resistive element 54 correspond to the load circuit. When the output signal of the signal output unit 11 is to rise, the switch circuit 42 is made conductive to electrically connect the resistive element 44 to the signal output node A, and the switch circuit 52 is made nonconductive to electrically disconnect the resistive element 54 from the signal output node A for electrical discharge. The adjustment of a resistance value of the resistive element 44 may control the speed of voltage rise at the signal output node A.

When the output signal of the signal output unit 11 is to fall, the switch circuit 42 is made nonconductive to electrically disconnect the resistive element 44 from the signal output node A, and the switch circuit 52 is made conductive to electrically connect the resistive element 54 to the signal output node A. The adjustment of a resistance value of the resistive element 54 may control the speed of voltage fall at the signal output node A.

Figure 19:
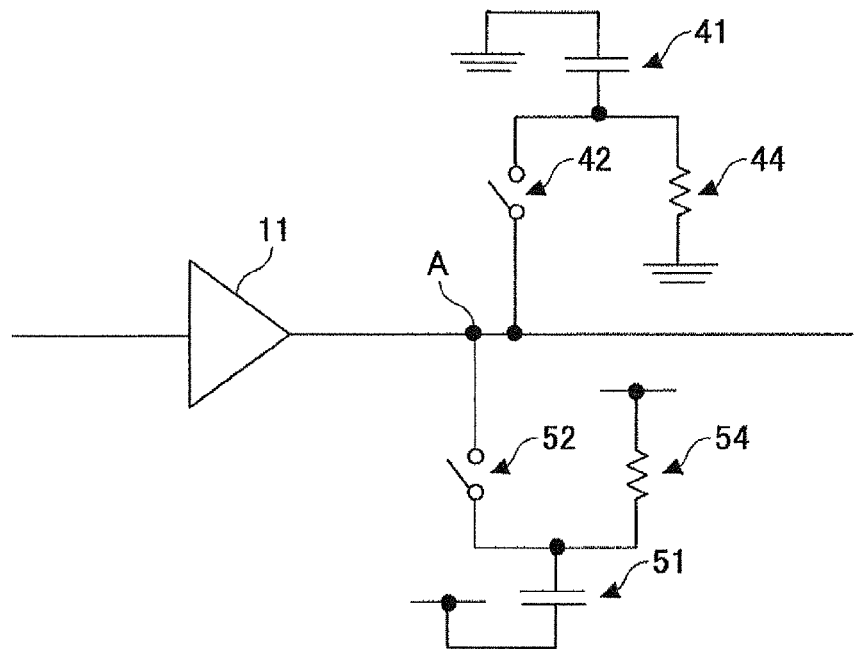
FIG. 19 is a drawing illustrating another variation of the embodiment of an output circuit.

FIG. 19 is a drawing illustrating another variation of the embodiment of an output circuit. In FIG. 19, an output circuit includes the signal output unit 11, the capacitive element 41, the switch circuit 42, the resistive element 44, the capacitive element 51, the switch circuit 52, and the resistive element 54. The capacitive element 41, the resistive element 44, the capacitive element 51, and the resistive element 54 correspond to the load circuit. When the output signal of the signal output unit 11 is to rise, the switch circuit 42 is made conductive to electrically connect the capacitive element 41 and resistive element 44 to the signal output node A, and the switch circuit 52 is made nonconductive to electrically disconnect the capacitive element 51 and resistive element 54 from the signal output node A for electrical discharge. The adjustment of a capacitance value of the capacitive element 41 and of a resistance value of the resistive element 44 may control the speed of voltage rise at the signal output node A.

When the output signal of the signal output unit 11 is to fall, the switch circuit 42 is made nonconductive to electrically disconnect the capacitive element 41 and resistive element 44 from the signal output node A for electrical discharge, and the switch circuit 52 is made conductive to electrically connect the capacitive element 51 and resistive element 54 to the signal output node A. The adjustment of a capacitance value of the capacitive element 51 and of a resistance value of the resistive element 54 may control the speed of voltage fall at the signal output node A.

Figure 20:
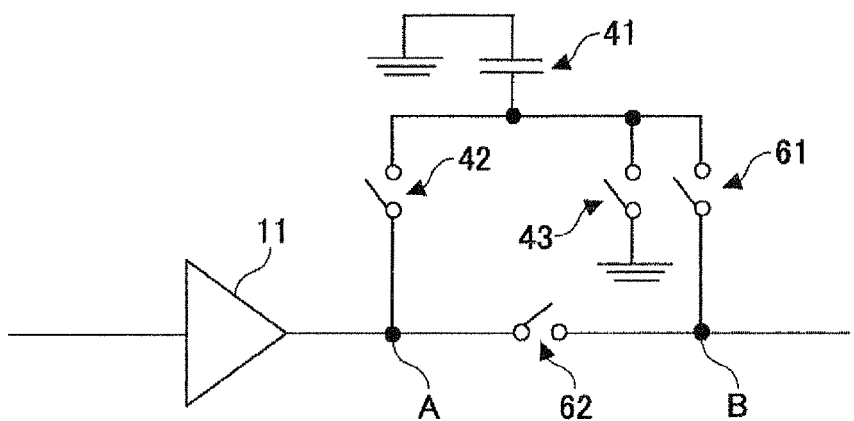
FIG. 20 is a drawing illustrating another variation of the embodiment of an output circuit.

FIG. 20 is a drawing illustrating another variation of the embodiment of an output circuit. In FIG. 20, an output circuit includes the signal output unit 11, the capacitive element 41, the switch circuits 42 and 43, a switch circuit 61, and a switch circuit 62. A first signal path coupling between a signal node B and the signal output node A has the switch circuit 62 inserted therein. The switch circuit 61 is inserted between the signal node B and the capacitive element 41. The switch circuits 42, 43, 61 and 62 may be controlled to select one of the above-noted first signal path and a second signal path that extends from the signal output node A to the signal node B via the switch circuit 42 and the switch circuit 61.

When the output signal of the signal output unit 11 is to rise, the switch circuits 42 and 43 are made conductive and nonconductive, respectively, to electrically connect the capacitive element 41 to the signal output node A. Further, the switch circuits 61 and 62 are made conductive and nonconductive, respectively. The adjustment of a capacitance value of the capacitive element 41 may control the speed of voltage rise at the signal output node A.

When the output signal of the signal output unit 11 is to fall, the switch circuits 42, 43, and 61 are made nonconductive, conductive, and nonconductive, respectively, to electrically disconnect the capacitive element 41 from the signal output node A and signal node B for electrical discharge. In this case, the speed of signal fall at the signal output node A is not affected by the capacitive element 41. When this happens, the switch circuit 62 is made conductive to allow the output signal of the signal output unit 11 to propagate from the signal output node A to the signal node B via the switch circuit 62.

Figure 21:
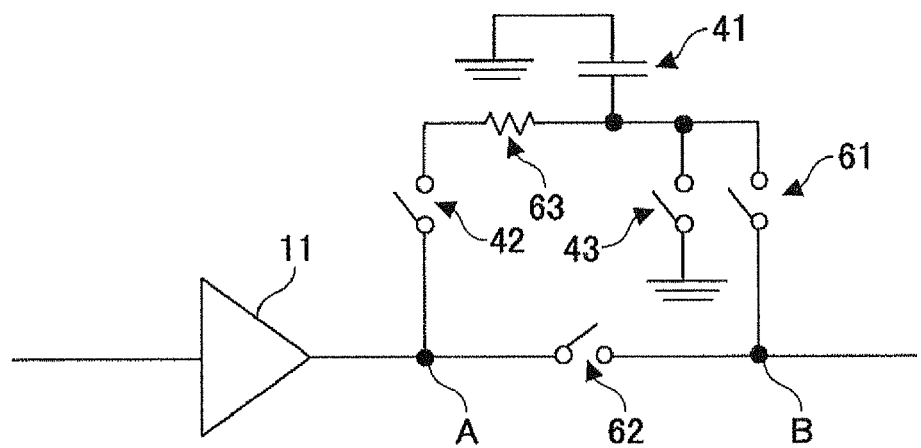
FIG. 21 is a drawing illustrating another variation of the embodiment of an output circuit.

FIG. 21 is a drawing illustrating another variation of the embodiment of an output circuit. The same elements as those of FIG. 20 are referred to by the same numerals, and a description thereof will be omitted.

The output circuit of FIG. 21 differs from the output circuit of FIG. 20 in that a resistive element 63 is serially inserted into the second path. The resistance value of the resistive element 63 is adjusted in addition to the adjustment of a capacitance value of the capacitive element 41, thereby controlling the slope (i.e., speed) of a signal voltage rise.

Figure 22:
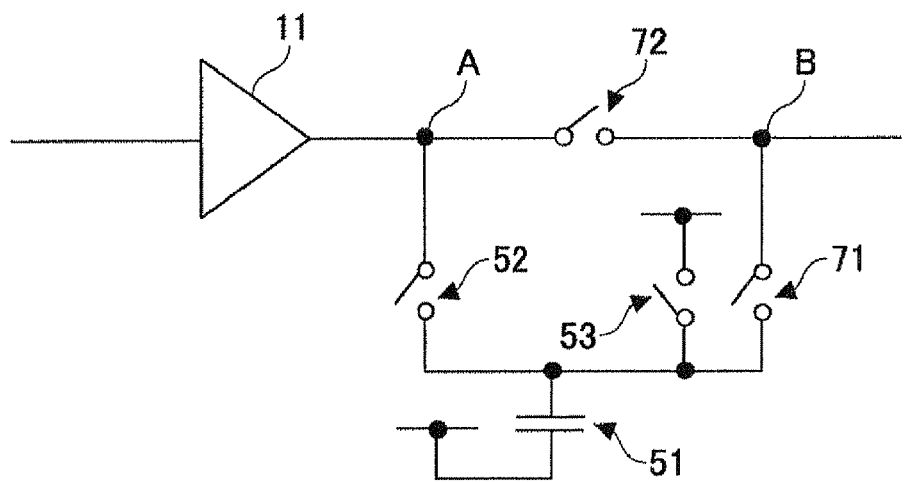
FIG. 22 is a drawing illustrating another variation of the embodiment of an output circuit.

FIG. 22 is a drawing illustrating another variation of the embodiment of an output circuit. In FIG. 22, an output circuit includes the signal output unit 11, the capacitive element 51, the switch circuits 52 and 53, a switch circuit 71, and a switch circuit 72. A first signal path coupling between the signal node B and the signal output node A has the switch circuit 72 inserted therein. The switch circuit 71 is inserted between the signal node B and the capacitive element 51. The switch circuits 52, 53, 71 and 72 may be controlled to select one of the above-noted first signal path and a second signal path that extends from the signal output node A to the signal node B via the switch circuit 52 and the switch circuit 71.

When the output signal of the signal output unit 11 is to fall, the switch circuits 52 and 53 are made conductive and non-conductive, respectively, to electrically connect the capacitive element 51 to the signal output node A. Further, the switch circuits 71 and 72 are made conductive and nonconductive, respectively. The adjustment of a capacitance value of the capacitive element 51 may control the speed of voltage fall at the signal output node A.

When the output signal of the signal output unit 11 is to rise, the switch circuits 52, 53, and 71 are made nonconductive, conductive, and nonconductive, respectively, to electrically disconnect the capacitive element 51 from the signal output node A and signal node B for electrical discharge. In this case, the speed of signal rise at the signal output node A is not affected by the capacitive element 51. When this happens, the switch circuit 72 is made conductive to allow the output signal of the signal output unit 11 to propagate from the signal output node A to the signal node B via the switch circuit 72.

Figure 23:
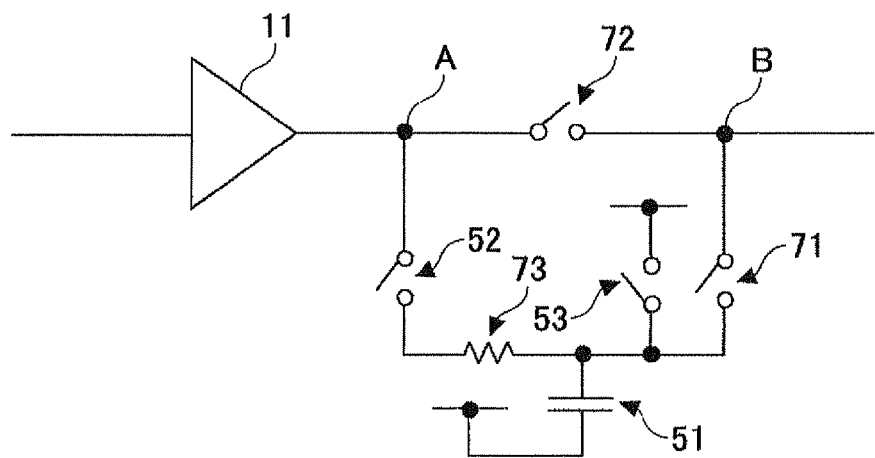
FIG. 23 is a drawing illustrating another variation of the embodiment of an output circuit.

FIG. 23 is a drawing illustrating another variation of the embodiment of an output circuit. The same elements as those of FIG. 22 are referred to by the same numerals, and a description thereof will be omitted.

The output circuit of FIG. 23 differs from the output circuit of FIG. 22 in that a resistive element 73 is serially inserted into the second path. The resistance value of the resistive element 73 is adjusted in addition to the adjustment of a capacitance value of the capacitive element 51, thereby controlling the slope (i.e., speed) of a signal voltage fall.

Figure 24:
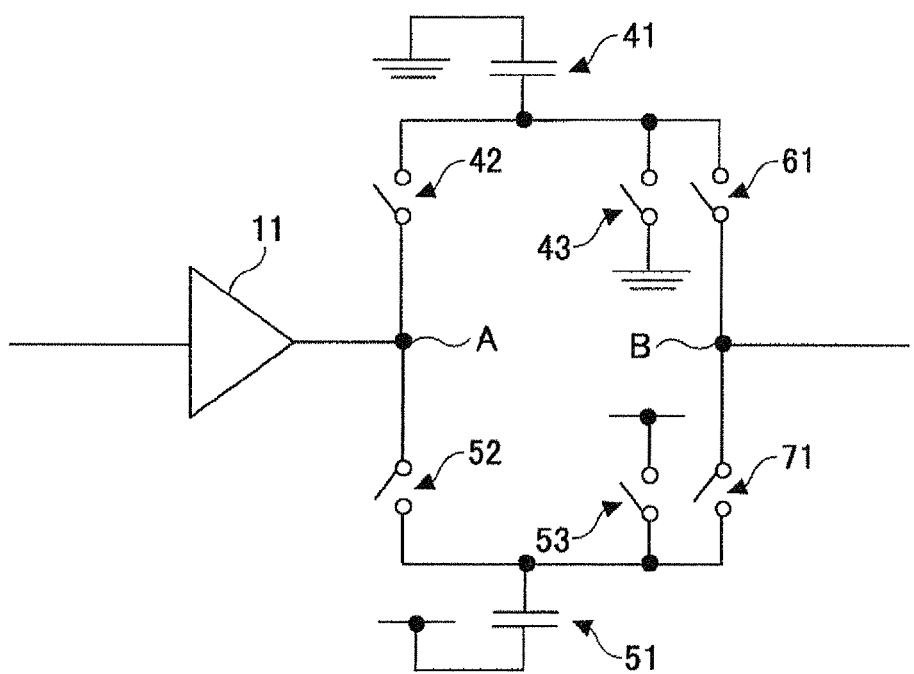
FIG. 24 is a drawing illustrating another variation of the embodiment of an output circuit.

FIG. 24 is a drawing illustrating another variation of the embodiment of an output circuit. In FIG. 24, an output circuit includes the signal output unit 11, the capacitive element 41, the switch circuits 42 and 43, the switch circuit 61, the capacitive element 51, the switch circuits 52 and 53, and the switch circuit 71.

When the output signal of the signal output unit 11 is to rise, the switch circuits 42 and 43 are made conductive and nonconductive, respectively, to electrically connect the capacitive element 41 to the signal output node A, and the switch circuit 61 is made conductive to electrically connect the capacitive element 41 to the signal node B. The adjustment of a capacitance value of the capacitive element 41 may control the speed of voltage rise at the signal output node A. During the above-described operation, the switch circuits 52, 53, and 71 are made nonconductive, conductive, and nonconductive, respectively, to electrically disconnect the capacitive element 51 from the signal output node A and signal node B for electrical discharge.

When the output signal of the signal output unit 11 is to fall, the switch circuits 52 and 53 are made conductive and nonconductive, respectively, to electrically connect the capacitive element 51 to the signal output node A, and the switch circuit 71 is made conductive to electrically connect the capacitive element 51 to the signal node B. The adjustment of a capacitance value of the capacitive element 51 may control the speed of voltage fall at the signal output node A. During the above-described operation, the switch circuits 42, 43, and 61 are made nonconductive, conductive, and nonconductive, respectively, to electrically disconnect the capacitive element 41 from the signal output node A and signal node B for electrical discharge.

Figure 25:
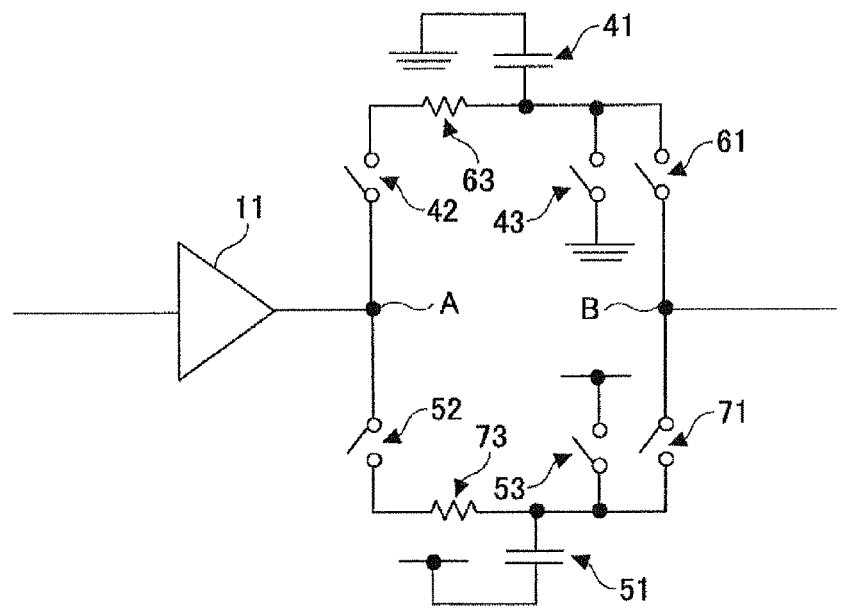
FIG. 25 is a drawing illustrating another variation of the embodiment of an output circuit.

FIG. 25 is a drawing illustrating another variation of the embodiment of an output circuit. The same elements as those of FIG. 24 are referred to by the same numerals, and a description thereof will be omitted.

The output circuit of FIG. 25 differs from the output circuit of FIG. 24 in that the resistive element 63 is serially inserted into the path connecting between the signal output node A and the signal node B on the capacitive element 41 side, and in that the resistive element 73 is serially inserted into the path connecting between the signal output node A and the signal node B on the capacitive element 51 side. The resistance values of the resistive elements 63 and 73 are adjusted in addition to the adjustment of capacitance values of the capacitive elements 41 and 51, thereby controlling the slope of a signal rise and the slope of a signal fall.

Figure 26:
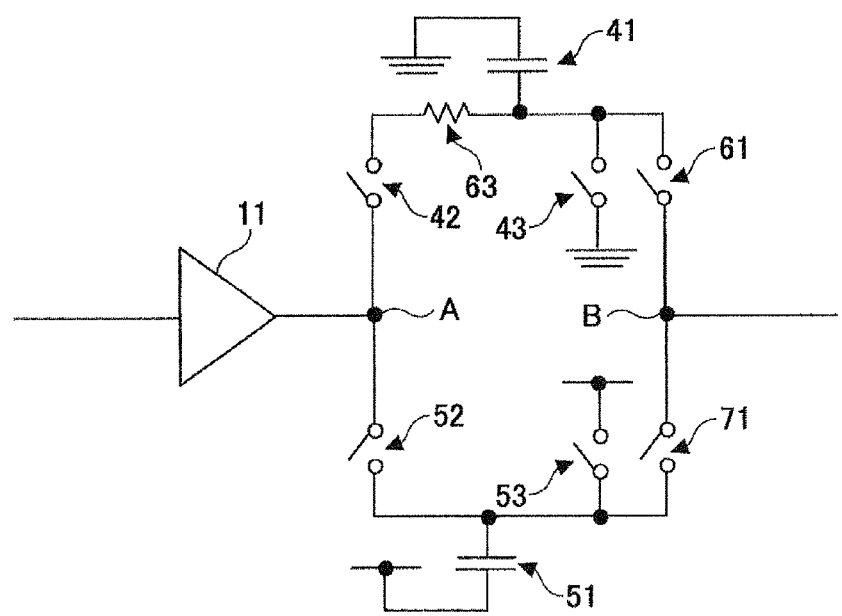
FIG. 26 is a drawing illustrating another variation of the embodiment of an output circuit.

FIG. 26 is a drawing illustrating another variation of the embodiment of an output circuit. The same elements as those of FIG. 24 are referred to by the same numerals, and a description thereof will be omitted.

The output circuit of FIG. 26 differs from the output circuit of FIG. 24 in that the resistive element 63 is serially inserted into the path that connects between the signal output node A and the signal node B on the capacitive element 41 side. The resistance value of the resistive element 63 is adjusted in addition to the adjustment of a capacitance value of the capacitive element 41, thereby controlling the slope (i.e., speed) of a signal voltage rise. It should be noted that a serially inserted resistor is not provided along the path that connects between the signal output node A and the signal node B on the capacitive element 51 side.

Figure 27:
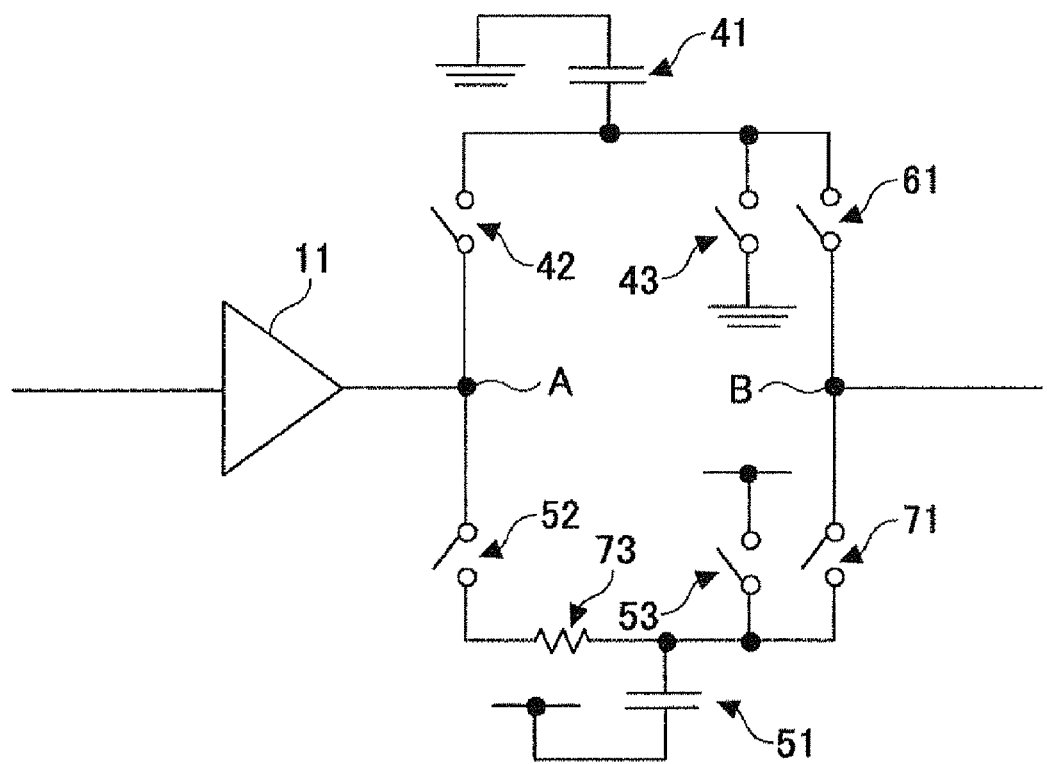
FIG. 27 is a drawing illustrating another variation of the embodiment of an output circuit.

FIG. 27 is a drawing illustrating another variation of the embodiment of an output circuit. The same elements as those of FIG. 24 are referred to by the same numerals, and a description thereof will be omitted.

The output circuit of FIG. 27 differs from the output circuit of FIG. 24 in that the resistive element 73 is serially inserted into the path that connects between the signal output node A and the signal node B on the capacitive element 51 side. The resistance value of the resistive element 73 is adjusted in addition to the adjustment of a capacitance value of the capacitive element 51, thereby controlling the slope (i.e., speed) of a signal voltage fall. It should be noted that a serially inserted resistor is not provided along the path that connects between the signal output node A and the signal node B on the capacitive element 41 side.

According to aforementioned embodiment, an output circuit that is of relatively small scale and performs adjustment to make the output-signal rise slew rate and the fall slew rate equal to each other is provided.

According to at least one embodiment, the conduction and non-conduction of the first switch circuit makes it possible to electrically connect the load circuit to the signal output node at the time of signal rise transition, for example, and to electrically disconnect the load circuit from the signal output node at the time of signal fall transition.

Accordingly, adjustment of the size of load of the load circuit makes it possible to adjust the slope of a rise edge thereby to make it equal to the slope of a fall edge. Namely, such control is attained that one of the signal rise edge and the signal fall edge is controlled independently of the other to make the slopes of these two edges equal to each other. It suffices to add only the switch circuit and the load circuit, so that an output circuit having a slew rate adjustment function may be implemented through a relatively small circuit scale.

Further, the present invention is not limited to these embodiments, but various variations and modifications may be made without departing from the scope.

The invention claimed is:

1. An output circuit, comprising:
   a signal output unit configured to produce at a signal output node a signal that makes transition between a first potential and a second potential;
   a load circuit having a variable load to be imposed on the signal output node; and
   a first switch circuit configured to select one of electrical conduction and non-conduction between the signal output node and the load circuit,
   wherein the electrical conduction and non-conduction of the first switch circuit is controlled substantially in synchronization with transitions of the signal between the first potential and the second potential.

2. The output circuit as claimed in claim 1, further comprising:
   a second switch circuit connected to the signal output node; and
   a load circuit having a variable load coupled to the signal output node via the second switch circuit.

3. The output circuit as claimed in claim 2, wherein the first switch circuit and the second switch circuit are configured to become conductive alternately.

4. The output circuit as claimed in claim 1, wherein the signal output unit includes:
   a third switch circuit configured to select one of electrical conduction and non-conduction between the signal output node and the first potential; and
   a fourth switch circuit configured to select one of electrical conduction and non-conduction between the signal output node and the second potential,
   wherein the third switch circuit comprises a PMOS transistor, and the fourth switch circuit comprises an NMOS transistor.

5. The output circuit as claimed in claim 1, wherein the signal output node is configured to be settable to a HIGH-impedance state by placing an output of the signal output unit in a HIGH-impedance state and making the first switch circuit nonconductive.

6. The output circuit as claimed in claim 1, further comprising:
   a signal node;
   a first signal path to couple between the signal node and the signal output node; and
   a second switch circuit disposed between the signal node and the load circuit,
   wherein a second signal path that extends from the signal output node to the signal node via the first switch circuit, the load circuit, and the second switch circuit is provided such that one of the first signal path and the second signal path is selectable.

7. The output circuit as claimed in claim 6, further comprising a resistive element serially inserted into one of the first signal path and the second signal path.

8. The output circuit as claimed in claim 1, wherein the load circuit includes a variable-capacitance element.

9. The output circuit as claimed in claim 8, further comprising a switch circuit configured to couple a predetermined potential to a signal node between the variable-capacitance element and the first switch circuit.

10. The output circuit as claimed in claim 8, further comprising a resistive element to couple a predetermined potential to a signal node between the variable-capacitance element and the first switch circuit.

11. The output circuit as claimed in claim 1, wherein the load circuit includes a variable-resistance element.

* * * * *